United States Patent [19]

Sasame et al.

[11] Patent Number: 4,965,659
[45] Date of Patent: Oct. 23, 1990

[54] MEMBER FOR A SEMICONDUCTOR STRUCTURE

[75] Inventors: Akira Sasame; Hitoyuki Sakanoue; Masaya Miyake; Akira Yamakawa, all of Hyogo, Japan

[73] Assignee: Sumitomo Electric Industries, Ltd., Osaka, Japan

[21] Appl. No.: 212,950

[22] Filed: Jun. 28, 1988

[30] Foreign Application Priority Data

Jun. 30, 1987 [JP] Japan .................................. 62-162838
Jun. 30, 1987 [JP] Japan .................................. 62-162839
Jun. 30, 1987 [JP] Japan .................................. 62-162840
Jun. 30, 1987 [JP] Japan .................................. 62-162841

[51] Int. Cl.$^5$ .................................................. H01L 23/02
[52] U.S. Cl. ........................................ 357/81; 357/71; 357/74
[58] Field of Search ............................. 357/81, 74, 71

[56] References Cited

U.S. PATENT DOCUMENTS 4,321,617  3/1982  Duda et al. ............................ 357/71

FOREIGN PATENT DOCUMENTS 0100232  2/1984  European Pat. Off. ............ 357/81
0217584  4/1987  European Pat. Off. ............ 357/81
58-48926  3/1983  Japan .................................. 357/81
59-114846  7/1984  Japan .................................. 357/74

OTHER PUBLICATIONS

IBM Technical Disclosure Bulletin, vol. 20, No. 4, Sep. 1977, "Air-Cooled Module Heat Dissipation", by G. Dumaine et al.

Primary Examiner—Andrew J. James
Assistant Examiner—Steven Loke
Attorney, Agent, or Firm—W. G. Fasse; D. H. Kane, Jr.

[57]  ABSTRACT

A member for a semiconductor structure is constructed, for example, as a mounting, or as a cover, or as a heat sink. Such a component is obtained by joining an aluminum nitride insulating substrate and a radiating element. The metal material for forming the radiating member has a thermal conductivity of at least 120 W/mK and a thermal expansion coefficient within a range of 4 to $6.0 \times 10^{-6}/K^{-1}$. Preferably the material forming the radiating element is made of a tungsten alloy containing copper by not more than 5 percent by weight.

9 Claims, 5 Drawing Sheets

MEMBER FOR A SEMICONDUCTOR STRUCTURE

BACKGROUND OF THE INVENTION

1. Field of the Invention

The present invention relates to a member for a semiconductor structure, and more particularly, it relates to a substrate for a semiconductor device or structure, which must be of high thermal conductivity to be mounted with a semiconductor device of high calorific power such as a high-power transistor or a laser diode.

2. Background Information

A member for a semiconductor structure to be mounted with a semiconductor device is generally formed by an insulating member and a radiating member joined to the insulating member. For example, such a member for a semiconductor structure is formed by an insulating substrate to be provided thereon with a semiconductor device and a radiating substrate joined to the back surface of the insulating substrate by soldering with silver solder or the like. In this case, generally the substrate must have the following qualities, a high electric insulating ability for insulating the semiconductor device, high mechanical strength, and a high thermal conductivity for dissipating heat generated by the semiconductor device. The radiating or heat removing substrate must have a high thermal conductivity similarly to the insulating substrate, while its thermal expansion coefficient must approximate those of the materials forming a semiconductor substrate, the insulating substrate and the like.

In general, alumina ($Al_2O_3$) is selected as a material satisfying the aforementioned properties for forming the insulating substrate employed in such a member for a semiconductor structure. However, although alumina is excellent in electric insulability and mechanical strength, its heat dissipation property is inferior due to a small thermal conductivity of 17 $Wm^{-1}K^{-1}$. Thus, it is improper to mount a field-effect transistor (FET) of high calorific power, for example, on an alumina substrate. In order to mount a semiconductor device of high calorific power, another type of insulating substrate is made of beryllia (BeO) having a high thermal conductivity of 260 $Wm^{-1}K^{-1}$. However, beryllia is toxic and hence it is troublesome to assure the necessary safety measures when using such an insulating substrate.

The radiating substrate or rather element is generally made of material satisfying the aforementioned properties, which material is selected from metal materials such as various types of copper alloys, copper-tungsten alloys and copper-molybdenum alloys. For example, Japanese Patent Laying-Open Gazette No. 21032/1984 discloses a substrate of high thermal conductivity for carrying a semiconductor device, the material of which is prepared by mixing 2 to 30 percent by weight of copper into tungsten or molybdenum. This substrate is employed as a radiating substrate which is suitably joined to an alumina substrate having an inferior heat dissipation property. However, the difference between the thermal expansion coefficients of the radiating substrate and the alumina substrate is relatively small. Thus, this prior art example has an insufficient heat dissipation property, which is required of an entire substrate for carrying a semiconductor device.

In recent years, nontoxic aluminum nitride (AlN) has generated a great interest as a material for such an insulating substrate for mounting a semiconductor device of high calorific power because of its high thermal conductivity of about 200 $Wm^{-1}K^{-1}$, which value is substantially equal to that of beryllia, as well as its electric insulation ability and mechanical strength which are equivalent to those of alumina.

However, when an aluminum nitride substrate provided with a metallized layer, is soldered by a soldering metal such as a gold solder or a silver solder, for example, to a generally employed radiating or heat sink element of a copper-tungsten alloy or copper-molybdenum alloy containing 10 to 25 percent by weight of copper, the aluminum nitride substrate may crack or the radiating element of the copper-tungsten alloy or the copper-molybdenum alloy may warp.

Cracking or warping results from thermal stress caused by a difference in the thermal expansion coefficients between the copper-tungsten alloy or the copper-molybdenum alloy and aluminum nitride during a cooling step after soldering, which is performed at a temperature within the ramge of 500° to 950° C. This thermal stress may conceivably be left in the aluminum nitride substrate as tensile residual stress, to crack the aluminum nitride substrate and/or warp the radiating heat sink element of the copper-tungsten alloy or the copper-molybdenum alloy.

When an aluminum nitride substrate is joined to a radiating heat sink element of a copper-tungsten alloy or a copper-molybdenum alloy, by cold soldering or hot soldering, the aluminum nitride substrate or an interface-between the same and a metallized layer is cracked by a thermo cycle test ($-55°$ C. to $+150°$ C., 1000 cycles or a thermal shock test to cause a significant problem in practice, even if no warp nor crack is recognized at the time of joining.

In a sample of an aluminum nitride substrate joined to a radiating heat sink element of a copper-tungsten alloy or a copper-molybdenum alloy by silver soldering, thermal fatigue or thermal stress was caused in a thermo cycle test or a thermal shock test due to a difference between the thermal expansion coefficients of the radiating element of the copper-tungsten alloy or the copper-molybdenum alloy, and the aluminum nitride substrate, similarly to the above. Such a problem of thermal stress or thermal fatigue is aggravated with an increase in the junction area.

Thermal expansion coefficients of the copper-tungsten alloy or the copper-molybdenum alloy having the aforementioned composition and aluminum nitride are 6.5 to $10 \times 10^{-6}$/K and 4 to $5 \times 10^{-6}$/K respectively, within a range from room temperature to about 950° C. Further, these materials, having a high Young's modulus of 27,000 to 35,000 $Kg/mm^2$ and 35,000 to 37,000 $Kg/mm^2$ respectively, are hardly plastically deformed. Thus, when the copper-tungsten alloy or the copper-molybdenum alloy of the aforementioned composition and aluminum nitride are joined with each other by soldering, a large thermal stress is conceivably caused in a cooling step.

SUMMARY OF THE INVENTION

An object of the present invention is to provide a member for a semiconductor structure by employing an insulating member or element of aluminum nitride having excellent heat dissipation property, on which insulating element a semiconductor device of high calorific power is to be mounted, so that a radiating member or heat sink element mainly formed of a metal material having a high heat radiation property can be joined to the insulating member without any cracking or warping.

Specifically, it is the aim of the invention to find a metal material having a thermal expansion coefficient substantially equal to that of aluminum nitride and a high heat radiation property, which material is suitably applied to a radiating member to be joined to an insulating member of aluminum nitride for preventing cracking or warping caused by thermal stress in a cooling step after soldering.

A member for a semiconductor structure in accordance with the present invention adapted to carry or mount a semiconductor device, comprises an insulating element of aluminum nitride having a major surface to face the semiconductor device and a radiating element, to be joined to the insulating element, mainly formed of a metal material having a thermal conductivity of at least 120 W/mK and a thermal expansion coefficient within the range of 4 to $6.0 \times 10^{-6}$/K. The thermal expansion coefficient of the metal material forming the radiating element joined to the insulating element, is so selected that it is within the above range that the same is substantially equal to that of the aluminum nitride. Thus, the radiating element is not deformed and cracks are not caused in the insulating element of aluminum nitride when the two are joined by soldering. With regard to the heat radiation property, the thermal conductivity of the aluminum nitride joined to the radiating element is within a range of 120 to 280 Wm. Hence, the entire member in accordance with the present invention has a high heat radiation property.

Preferably the metal material forming the radiating element includes tungsten. The thermal expansion coefficient of tungsten is $4.5 \times 10^{-6}$/K, which value is substantially equal to that of aluminum nitride. Thus, even if an aluminum nitride substrate is joined to a tungsten metal plate by soldering at 800° to 950° C., the tungsten metal plate is not deformed and cracks are not caused in the aluminum nitride substrate element.

The metal material forming the radiating element may include a tungsten alloy, which contains at least nickel, copper, iron or cobalt. The thermal expansion coefficient of such a tungsten alloy is increased as the content of the above metal component(s) is increased, to differ substantially from that of aluminum nitride. Thus, the content of each metal component is limited to be not more than 10 percent by weight so that the thermal expansion coefficient of the tungsten alloy is substantially equal to that of aluminum nitride. If the total content of one or more such metal components is less than 0.01 percent by weight, a problem is caused since such a tungsten alloy plate has a poor machinability.

Further, the thermal conductivity, which is one of the properties required for the radiating element mainly formed of the tungsten alloy, must be considered. The content of each metal component is limited to be not more than 10 percent by weight, so that thermal conductivity of the tungsten alloy is at least 120 W/m.K. In view of the thermal expansion coefficient, the machinability and thermal conductivity, the content of each metal component is preferably within a range of 0.01 to 10 percent by weight. In particular, the most preferable tungsten alloy contains 1 to 7 percent by weight of nickel, 0.1 to 4 percent by weight of copper and 0.1 to 2 percent by weight of iron. It has been recognized that the thermal expansion coefficient is much increased in a tungsten alloy obtained by adding at least 10 percent by weight of copper to tungsten.

The thermal expansion coefficient of a copper-tungsten alloy containing only copper is increased with an increase in the content of copper, to differ substantially from that of aluminum nitride. In order to attain a thermal expansion coefficient substantially equal to that of aluminum nitride, it is optimal to employ a radiating member mainly formed of a copper-tungsten alloy containing 0.1 to 5 percent by weight of copper. If the copper content is not more than 0.1 percent by weight, it becomes difficult to cut a copper-tungsten alloy plate. At such low copper content the thermal conductivity, which is an excellent property of the copper-tungsten alloy plate, is reduced. If the copper content exceeds 5 percent by weight, the thermal expansion coefficient of the copper-tungsten alloy exceeds that of aluminum nitride, as hereinabove described.

The metal material forming the radiating element may include molybdenum. The thermal expansion coefficient of molybdenum is $5.5 \times 10^{-6}$/K, which value is substantially equal to that of aluminum nitride. Thus, even if an aluminum nitride substrate is joined to a molybdenum metal plate by soldering at 800° to 950° C., the molybdenum metal plate is not deformed and no crack is caused in the aluminum nitride substrate.

An insulating element of aluminum nitride is preferably employed as a substrate having a major surface for mounting a semiconductor device. Alternatively, the insulating element may be applied to a covering member for covering a semiconductor device to protect the same, which covering member forms a cap for airtightly sealing a semiconductor device mounted on an insulating substrate, for example. When the insulating element is employed as a substrate for carrying a semiconductor device or a covering member for protecting a semiconductor device, the present member is adapted to conduct heat generated by the semiconductor device, to the insulating member and to the radiating heat sink element, thereby to dissipate the heat to the exterior. The insulating member of aluminum nitride preferably includes a sintered body.

The insulating element of aluminum nitride is preferably provided on its junction surface with a metallized layer, which contains at least tungsten or molybdenum, at least one aluminum compound within aluminum nitride, aluminum oxide and aluminum oxynitride, and calcium oxide or yttrium oxide, to attain a preferable junction strength and thermal conductivity.

The present member further comprises a soldering element for joining the metallized layer to the radiating element, and a plating layer is provided in a junction surface of the metallized layer with a soldering element to uniformly perform a stabilized soldering, since the wettability between the soldering element and the metallized layer can be improved by providing the plating layer. Another plating layer provided in a junction surface of the radiating element with the soldering element functions similarly to the above. Such plating layers are preferably formed by nickel plating preferably performed particularly when gold plating is performed in a subsequent processing step, in order to improve adhesion and precipitation properties of the gold plating for forming a uniform gold plating layer.

According to the present member for a semiconductor structure, a metal material having the prescribed thermal conductivity and thermal expansion coefficient is employed as a main material for forming a radiating element of preventing cracking of the insulating element and warping of the radiating element upon joining of the insulating element of aluminum nitride and the radiating element. Thus, a reliable member for a semiconductor structure can be easily obtained to be used as a substrate for mounting a semiconductor device, a covering member for sealing a semiconductor device or the like.

These and other objects, features, aspects and advantages of the present invention will become more apparent from the following detailed description of the present invention when taken in conjunction with the accompanying drawings.

DESCRIPTION OF THE PREFERRED EMBODIMENTS AND OF THE BEST MODE OF THE INVENTION

Figure 1A:
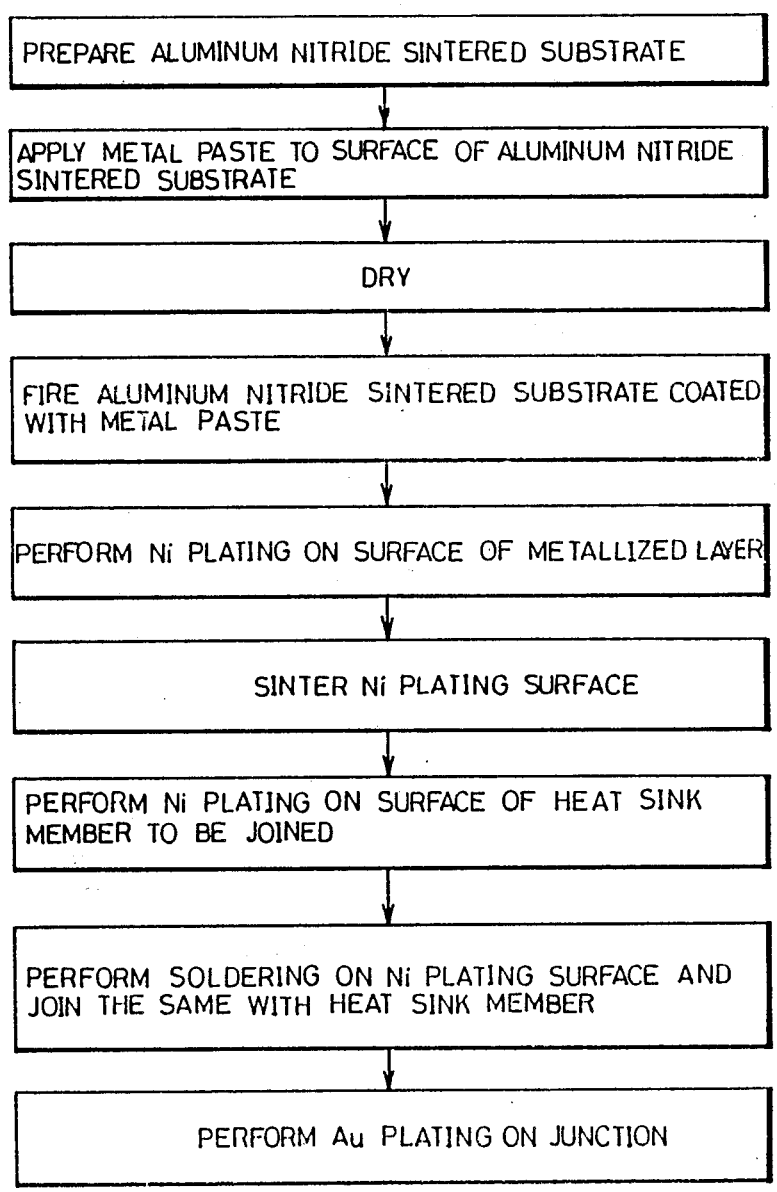
FIGS. 1A and 1B are process drawings schematically showing two exemplary methods of manufacturing a member for a semiconductor structure in accordance with the present invention.

As hereinabove described, the present invention is adapted to improve the technique of forming a member for a semiconductor structure by employing an insulating element of aluminum nitride in the form of a sintered body which, for example, is produced by the following method.

The insulating element formed as an aluminum nitride sintered body employed in the present invention, is preferably mainly composed of aluminum nitride and contains 0.01 to 1.0 percent by weight of an element belonging to the group IIIa of the periodic table and 0.001 to 0.5 percent by weight of oxygen, and its thermal conductivity is at least 180 $Wm^{-1}K^{-1}$. First, at least one compound containing a rare earth element is mixed with powder of aluminum nitride, so that its content is 0.01 to 1.0 percent by weight in rare earth element conversion. A forming agent, such as paraphine, PVD or PEG is added. A substance, such as phenol resin, being decomposed to leave carbon, carbon powder, graphite powder or the like may be added to control residual carbon in the sintered body. The rare earth compound is prepared as stearic acid, palmitic acid, alkoxide nitrate, carbonate, hydroxide or the like. Preferably employed is a high molecule compound such as stearic acid. Such a compound is conceivably adapted to reduce the content of the rare earth element to enable good mixing with aluminum nitride powder.

In particular, stearic acid is most preferable in view of its mixability with aluminum nitride powder, and due to the amount of residual carbon etc. because of its function as a forming additive. The aluminum nitride powder must be made to contain fine uniform particles. Preferably the average particle size is not more than 1 $\mu$m, and the oxygen content is not more than 2.0 percent by weight. Such aluminum nitride powder is obtained by a reduction nitriding method (method by reduction nitriding of aluminum oxide), since it is difficult to obtain the same by a direct nitriding method (method by nitriding of metal aluminum). In order to obtain the powder by the direct nitriding method, sufficient consideration must be given to the reaction control, classification of the particle size and the like.

Then the mixed powder is shaped into a prescribed configuration and sintered in a non-oxidizing atmosphere containing nitrogen. In order to attain a high thermal conductivity, it is preferable to sinter the substance at a temperature of 1000° to 2100° C. for at least five hours, so that its average particle size is at least 5 $\mu$m. After such sintering, it is preferable to quickly carry out a cooling step. If the substance is slowly cooled, a sintering surface additive is precipitated and the sintered is extremely deteriorated. Therefore, the sintered body is preferably cooled to a temperature of 1500° C. at a rate of at least 200° C./h.

The steps of forming a metallized layer on the surface of a substrate formed by the aluminum nitride sintered body obtained in the aforementioned manner are performed as follows:

First, a substrate is made of the aluminum nitride sintered body formed by the aforementioned method. A material for the metallized layer is prepared by kneading powder of a calcium compound, of an aluminum compound, and a metal powder of tungsten or molybdenum with an addition of an organic binder such as vehicle, to provide a metal paste. The contents of the respective components may be within the ranges of 40 to 98 percent by weight of the metal powder, 1 to 25 percent by weight of the aluminum compound and 1 to 35 percent by weight of calcium oxide. In order to perform a later sintering step at a low temperature, copper or nickel may be added as a catalyst for reducing the sintering temperature. The metal paste thus provided is applied to the surface of the substrate formed by the aluminum nitride sintered body which is then fired in an inert atmosphere of nitrogen or the like at a temperature of 1500° to 1800° C., to form a metallized layer on the substrate surface. A metallized layer prepared by metal powder of tungsten and containing 1 to 10 percent by weight of aluminum oxide, employed as the aluminum compound, and 1 to 20 percent by weight of calcium oxide, or that prepared by metal powder of molybdenum and containing 1 to 10 percent by weight of aluminum oxide, employed as the aluminum compound, and 1 to 35 percent by weight of calcium oxide is preferable in view of the adhesion between the substrate formed by the aluminum nitride sintered body and the metallized layer, and in view of the desired thermal conductivity.

The steps of forming a metallized layer on the surface of a substrate formed by the aluminum nitride sintered body may be performed as follows, by sintering an aluminum nitride formed body previously coated with the metal paste.

First, a substrate of the aluminum nitride formed body is prepared by shaping the aforementioned mixed powder into a prescribed configuration such as a green sheet. A material for the metallized layer is prepared by kneading powder of tungsten and at least one additive selected from a group of aluminum oxide, aluminum nitride, calcium oxide, yttrium oxide and stearic acid yttrium and the like, to provide a metal paste, similarly to the above described steps. The metal paste thus provided, is applied to the surface of the substrate formed by the aluminum nitride shaped body, by printing or coating. The substrate formed by the aluminum nitride shaped body is sintered with the applied metal paste under conditions similar to those disclosed above. The resulting aluminum nitride sintered body with its metallized surface has a high thermal conductivity.

Figure 1B:
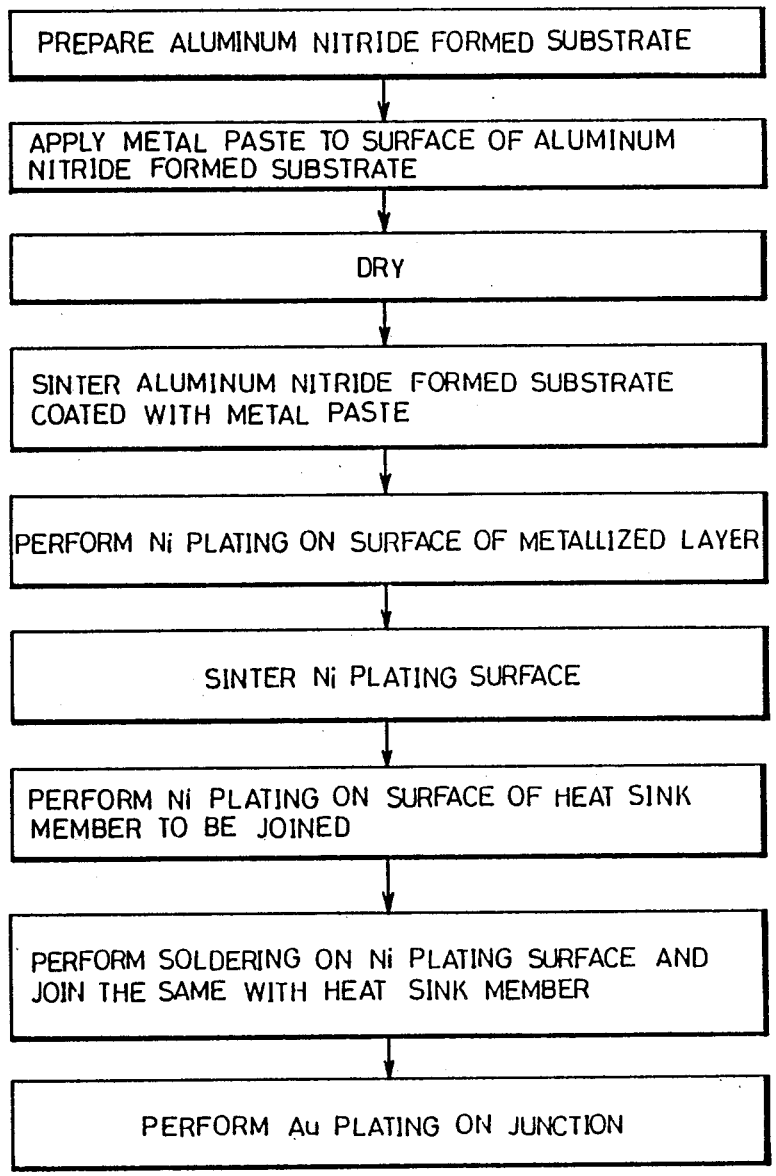

A typical method of forming the present member will now be described with reference to FIGS. 1A and 1B. First, on aluminum nitride sintered substrate is prepared. Then, the metal paste obtained through the aforementioned method is applied to the surface of the aluminum nitride sintered substrate. Thereafter the metal paste thus applied is dried. Then the aluminum nitride sintered substrate is fired in an inert gas atmosphere which is heated to a prescribed temperature.

The above steps may be performed as follows. Referring to FIG. 1B, an aluminum nitride formed substrate is first prepared. Then, the metal paste obtained through the aforementioned method is applied to the surface of the aluminum nitride formed substrate. Thereafter the metal paste thus applied is dried. Then the aluminum nitride formed substrate is sintered with the metal paste in an inert gas atmosphere which is heated to a prescribed temperature. Thus, an aluminum nitride sintered substrate with a metallized layer has been formed.

After a metallized layer has been formed on the aluminum nitride sintered substrate, the metallized layer is nickel plated. Then, a heat treatment is performed at a temperature of about 800° C. to sinter the nickel plating, thereby to improve the strength and airtightness of the nickel plating. The nickel plating is also applied on the surface of a heat sink element, serving as a radiating element, which is joined to the aluminum nitride sintered substrate, similarly as described above. Then soldering is performed on the nickel plating surface in order to join the aluminum nitride sintered substrate to the heat sink element. Further, gold plating is performed on such a junction.

Description is now made on an embodiment of a member for a semiconductor structure in accordance with an aspect of the present invention, which is manufactured along the aforementioned steps, such as a member comprising an aluminum nitride substrate joined to a lead frame on its surface and to a heat sink element on its back surface, with reference to the drawings.

Figure 2A:
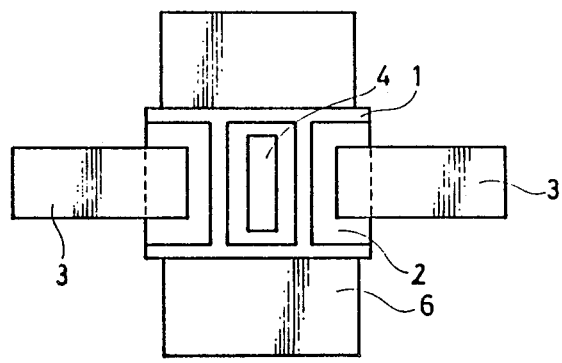
FIGS. 2A, 2B and 2C are a plan view and sectional views showing an example of a junction structure in a member according to the present invention, such as a junction structure between a lead frame, an aluminum nitride substrate and a radiating heat sink element.
Figure 2B:
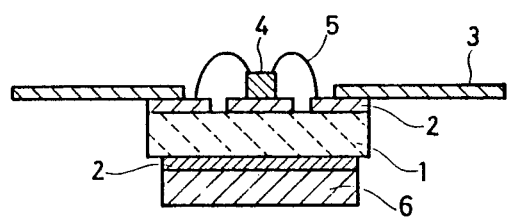
Figure 2C:
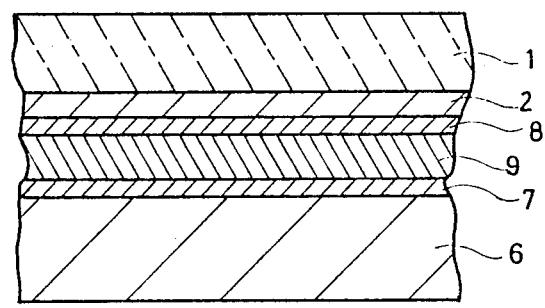

FIG. 2A is a plan view showing an embodiment which is applied to a substrate for mounting a semiconductor device, FIG. 2B is a sectional view of the substrate and FIG. 2C is a sectional view showing a junction between a heat sink element 6 and an aluminum nitride substrate 1 in detail. Referring to these figures, the aluminum nitride substrate 1 has at least, partially on its surface, aforementioned steps, and a lead frame 3 is joined to the metallized layer 2 through soldering by a soldering metal or the like. Another metallized layer 2 is formed on a part of the back surface of the aluminum nitride substrate 1 in accordance with the aforementioned steps, while the heat sink element 6 is joined to the metallized layer 2 through soldering by a soldering metal or the like. A semiconductor device 4 such as an FET of high calorific power, is mounted in a prescribed position on the aluminum nitride substrate 1, to be connected with the metallized layer 2 or the lead frame 3 by a bonding wire 5. As shown in FIG. 2C, a thin plating layer 8 is formed on the metallized layer 2 in the junction between the aluminum nitride substrate 1 and the heat sink element 6, while a plating layer 7 is formed as needed on the surface of the heat sink element 6, in order to stabilize the wettability of a soldering metal 9.

Figure 3:
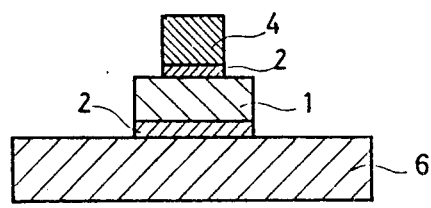
FIG. 3 is a sectional view showing an embodiment of a member in accordance with the present invention, which is applied to a heat sink element for a semiconductor device such as a light emitting diode (LED) or a laser diode (LD)

Another embodiment of the present element, which is applied to a radiating substrate for mounting a semiconductor device such as a diode having high calorific power, for example, will not be described with reference to FIG. 3. Referring to FIG. 3, an aluminum nitride substrate 1 is mounted on a heat sink element 6, serving as a radiating element mainly formed of the metal material in accordance with the present invention, through a metallized layer 2 provided as described above, while a semiconductor device 4, such as a light emitting diode (LED) or a laser diode (LD) is mounted on the aluminum nitride substrate 1 through the metallized layer 2. The semiconductor device 4 is joined to another metallized layer 2 which is formed on the opposite surface of the aluminum nitride substrate 1. In this case, the aluminum nitride substrate 1 also serves as a heat sink. The aluminum nitride substrate 1 and the heat sink element 6 are joined with each other in a similar manner to the above description with reference to the junction structure between the aluminum nitride substrate provided with the lead frame and the heat sink element.

Figure 4:
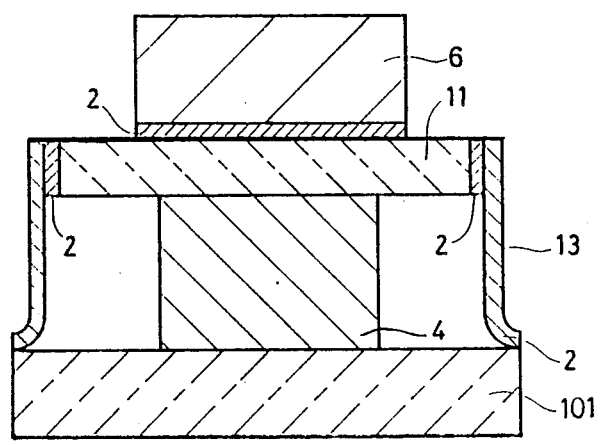
FIG. 4 is a sectional view showing another embodiment of the present member, applied as a cap or covering member for airtightly sealing a semiconductor device.

A cover or cap in accordance with the present invention will not be described with reference to FIG. 4. A metallized layer 2 is provided on the surface of a peripheral edge portion of a covering member 11 formed by an aluminum nitride sintered body. A frame member 13 of sheet metal, such as an iron-nickel alloy, is joined to the metallized layer 2 by a soldering metal or the like. The lower end of the frame member 13 is joined to a ceramic substrate 101 through another metallized layer similar to the layer 2. A semiconductor device 4 is mounted on the ceramic substrate 101. A heat sink element 6 is mounted on the upper surface of the covering member 11, so that heat generated by the semiconductor device 4 is dissipated by the heat sink element 6 through the covering member 11, to improve the cooling effect. The covering member 11 and the heat sink element 6 are joined to each other in a similar manner as described above with reference to the junction structure between the aluminum nitride substrate provided with the lead frame and the heat sink element. The soldering metal employed for such a junction is preferably a silver solder, while another soldering material is also available so far as a thin metal coating layer having a good wettability to the soldering material can be formed on the junction surface of the heat sink element 6 or the metallized layer 2 to strongly join the covering member 11 and the heat sink element 6 to each other. The function of such a thin metal coating layer, such as a plating layer, is as hereinabove described with reference to the example of junction structure between the aluminum nitride substrate provided with the lead frame and the heat sink element.

Examples 1 to 12, which were prepared by making samples in accordance with the aforementioned methods, will now be described.

EXAMPLE 1

Aluminum nitride sintered substrates of 1.3 mm in thickness were prepared by the aforementioned methods, to be subjected to metallization. The metallization processing was performed by applying metal paste of prescribed composition to the surface of respective samples of the aluminum nitride sintered substrates, performing debindering and then firing the same in a nitrogen atmosphere at a temperature of 1600° C. for 60 minutes. Thus, metallized layers were formed on prescribed surface portions of the aluminum nitride sintered substrates. The metal paste was prepared by adding calcium oxide powder and alumina power to tungsten powder and kneading the same with an organic binder such as vehicle. The content of calcium oxide was 14 percent by weight and that of alumina was 4 percent by weight. The shapes of the employed aluminum nitride sintered substrates were 5 mm square, 20 mm square and 50 mm square respectively.

Further, nickel plating layers of 2 μm in thickness were formed on the surfaces of the metallized layers. On the other hand, tungsten metal plates and copper-tungsten alloy plates of, 1.5 mm in thickness, were prepared as radiating members to be joined to the respective aluminum nitride sintered substrates. Nickel plating of 2 μm in thickness was performed on the surfaces of these metal plates, which were then soldered to the respective aluminum nitride sintered substrates by silver solder at a temperature of 830° to 950° C.

Figure 5:
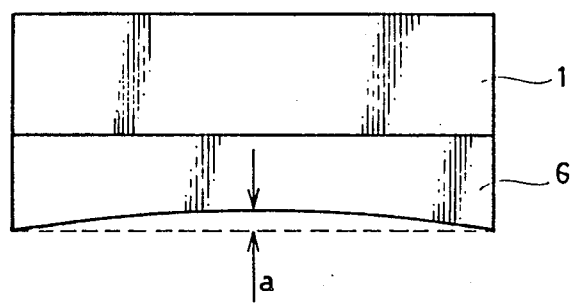
FIG. 5 is a side elevational view showing a portion subjected to measurement of a warp caused in a radiating element joined to an aluminum nitride substrate element.

Examination was made as to whether or not the aluminum nitride sintered substrates were cracked and whether or not the tungsten metal plates and the copper-tungsten alloy plates were warped in the respective samples thus obtained. As shown in FIG. 5, an aluminum nitride sintered substrate 1 and a heat sink element 6 of each sample were joined with each other, to evaluate the degree of warping as the amount a by a surface roughness tester (product of Tokyo Seimitsu: E-SP-S01A). Cracks caused in the respective aluminum nitride sintered substrates were observed by a scanning type electron microscope of 5000 magnifications or a steromicroscope of 40 magnifications. Table 1 shows the results. As to evaluation of warps, those of not more than 2 μm with respect to effective length of 1 mm were regarded as "no warp", while samples causing warps exceeding 2 μm with respect to effective length of 1 mm were regarded as "warped".

"10Cu-W" and "20Cu-W" in Table 1 represent reference examples, which were prepared by copper-tungsten alloys containing 10 percent by weight and 20 percent by weight of copper, respectively. The thermal expansion coefficient of the tungsten metal plates was $4.5 \times 10^{-6}/K$ and the thermal conductivity thereof was 168 W/mK. The thermal expansion coefficients of the copper-tungsten alloys 10Cu-W and 20Cu-W were 6.5 to $7.5 \times 10^{-6}/K$ and 8.5 to $9.5 \times 10^{-6}/K$ in the range of the room temperature to 950° C., respectively. The values of the thermal conductivity of the copper-tungsten alloys 10Cu-W and 20Cu-W were 210 W/mK and 246 W/mK, respectively.

According to Table 1, the reference examples prepared by joining the copper-tungsten alloy plates respectively containing 10 percent by weight and 20 percent by weight of copper to aluminum nitride sintered substrates were warped and cracked. On the other hand, no crack nor warp was caused in the samples in accordance with the present invention, which were prepared by joining tungsten metal plates to the aluminum nitride sintered substrate.

TABLE 1

| Sample Shape | W | 10Cu—W | 20Cu—W |
| --- | --- | --- | --- |
| □ 5 mm | no warp (no crack) | warped (no crack) | warped (cracked) |
| □ 20 mm | no warp (no crack) | warped (cracked) | warped (cracked) |
| □ 50 mm | no warp (no crack) | warped (cracked) | warped (cracked) |

EXAMPLE 2

Gold plating 3 μm in thick was performed on the surfaces of samples prepared in similar shapes to Example 1. The metallization processing of samples was performed by applying tungsten paste of prescribed composition to the surfaces of respective samples of the aluminum formed substrates shaped in a configuration, such as a green sheet, by the aforementioned method with screen printing of prescribed patterns, drying, performing debindering and then sintering the same in a nitrogen atmosphere at a temperature of 1850° C. for 5 hours. Thus, metallized layers were formed on prescribed surface portions of aluminum nitride sintered substrates. Before the above gold plated, nickel plating layers of 2 μm in thickness were formed on the metallized layers, and sintered in a hydrogen atmosphere at a temperature of 750° C. for 20 minutes. Then the aluminum nitride sintered substrates were soldered to tungsten metal plates or copper-tungsten alloy plates by gold soldering at a temperature of 450° to 550° C.

Examination was made as to cracks of the aluminum nitride sintered substrates and warps of the tungsten metal plates and the the copper-tungsten alloy plates similarly to Example 1. Table 2 shows the results.

According to Table 2, no warp nor crack was caused in the samples obtained by joining the tungsten metal plates to the aluminum nitride sintered substrates in accordance with the present invention.

TABLE 2

| Sample Shape | W | 10Cu—W | 20Cu—W |
| --- | --- | --- | --- |
| □ 5 mm | no warp (no crack) | warped (no crack) | warped (no crack) |
| □ 20 mm | no warp (no crack) | warped (no crack) | warped (cracked) |
| □ 50 mm | no warp (no crack) | warped (no crack) | warped (cracked) |

A thermo cycle test (−55° C., to +150° C., 1000 cycles) was pereformed on the samples causing no warp nor crack in Examples 1 and 2, while no problem was recognized.

EXAMPLE 3

On samples subjected to gold plating similarly to Example 2, soldering was performed by lead-indium solder at temperature of 250° to 300° C., and thereafter a thermo cycle test (−55° C. to +150° C., 1000 cycles) was performed. Structures in the interiors of aluminum nitride sintered substrates and metallized layers interfaces were observed in the respective samples to evaluate the degrees of cracking and the states of warps in tungsten metal plates and copper-tungsten alloy plates. Table 3 shows the results. The methods of evaluating cracks and warps are as described with reference to Example 1.

According to Table 3, no warp nor crack was recognized in the samples which were prepared by joining the tungsten metal plates to the aluminum nitride sintered substrates in accordance with the present invention.

TABLE 3

| Sample Shape | W | 10Cu—W | 20Cu—W |
|---|---|---|---|
| □ 5 mm | no warp (no crack) | no warp (cracked) | no warp (cracked) |
| □ 20 mm | no warp (no crack) | no warp (cracked) | no warp (cracked) |
| □ 50 mm | no warp (no crack) | warped (cracked) | warped (cracked) |

EXAMPLE 4

Samples obtained by performing nickel plating of 2 μm in thickness on aluminum nitride sintered substrates of 1.3 mm in thickness proviede with metallized layers similarly to Example 1, were soldered to tungsten alloy plates, 1.5 mm in thickness and having compositions as shown in Table 4, the surfaces of which were nickel-plated, by silver solder at a temperature of 830° to 950° C. Examination was performed on the respective samples thus obtained, as to cracks of the aluminum nitride sintered substrates and warps of the tungsten alloy plates. Table 4 shows the results. In the column of the tungsten alloy plates as shown in Table 4, for example, "5Ni-1Cu-W" represents a tungsten alloy containing 5 percent by weight of nickel and 1 percent by weight of copper. Such indication of tungsten alloy plates also applies to Tables 5 and 6 concerning Examples 5 and 6 as hereinafter described. The star * symbol indicates the reference examples. Table 4 also shows the values of the thermal conductivity and thermal expansion coefficients of the tungsten alloy plates.

According to Table 4, no warp nor crack was recognized in the samples which were obtained by joining the tungsten alloy plates to the aluminum nitride substrates in accordance with the present invention.

TABLE 4

| Thermal Conductivity (W/mK) | Thermal Expansion Coefficient (× 10⁻⁶K⁻¹) | Type of w-Alloy Plate | Sample Shape | | |
|---|---|---|---|---|---|
| | | | □ 5 mm | □ 20 mm | □ 50 mm |
| 95 | 5.5 | 5Ni—1Cu—W* | no warp (no crack) | no warp (no crack) | no warp (no crack) |
| 90 | 5.4 | 5Ni—1Fe—W* | no warp (no crack) | no warp (no crack) | no warp (no crack) |
| 89 | 5.2 | 1Ni—1Fe—W* | no warp (no crack) | no warp (no crack) | no warp (no crack) |
| 84 | 6.4 | 12Ni—12Fe—W* | warped (cracked) | warped (cracked) | warped (cracked) |
| 120 | 5.2 | 2Ni—1Co—W | no warp (no crack) | no warp (no crack) | no warp (no crack) |
| 98 | 5.7 | 7Ni—3Cu—1Fe—W* | no warp (no crack) | no warp (no crack) | no warp (no crack) |
| 151 | 5.1 | 2Ni—1Cu—0.5Fe—W | no warp (no crack) | no warp (no crack) | no warp (no crack) |
| 108 | 8.4 | 10Ni—12Cu—5Fe—W* | warped (cracked) | warped (cracked) | warped (cracked) |
| 142 | 5.0 | 1.8Ni—0.8Cu—0.9Fe—W | no warp (no crack) | no warp (no crack) | no warp (no crack) |
| 131 | 5.4 | 3.0Ni—1.6Cu—0.4Fe—W | no warp (no crack) | no warp (no crack) | no warp (no crack) |
| 96 | 5.6 | 7.1Ni—2.5Cu—0.4Fe—W* | no warp (no crack) | no warp (no crack) | no warp (no crack) |

EXAMPLE 5

Gold plating was performed on the surface of samples similar to those employed in Example 4, and then aluminum nitride sintered substrates were soldered to various types of tungsten alloy plates by gold solder at a temperture of 450° to 550° C. Examination was made on the respective samples thus obtained, as to cracks of the aluminum nitride sintered substrates and wraps of the tungsten alloy plates forming the heat sink element. Table 5 shows the results.

According to Table 5, no warp nor crack was recognized in the samples obtained by joining the tungsten alloy plates to the aluminum nitride sintered substrates in accordance with the present invention.

A thermo cycle test (−55° C. to +150° C., 1000 cycles) was made on the samples causing no warp nor crack in Examples 4 and 5, while no problem was recognized.

TABLE 5

| Thermal Conductivity (W/mK) | Thermal Expansion Coefficient (× 10⁻⁶K⁻¹) | Type of w-Alloy Plate | Sample Shape | | |
|---|---|---|---|---|---|
| | | | □ 5 mm | □ 20 mm | □ 50 mm |
| 95 | 5.5 | 5Ni—1Cu—W* | no warp (no crack) | no warp (no crack) | no warp (cracked) |
| 90 | 5.4 | 5Ni—1Fe—W* | no warp (no crack) | no warp (no crack) | no warp (cracked) |
| 89 | 5.2 | 1Ni—1Fe—W* | no warp (no crack) | no warp (no crack) | no warp (cracked) |
| 84 | 6.4 | 12Ni—12Fe—W* | warped (no crack) | warped (no crack) | warped (cracked) |

TABLE 5-continued

| Thermal Conductivity (W/mK) | Thermal Expansion Coefficient ($\times 10^{-6} K^{-1}$) | Type of w-Alloy Plate | Sample Shape | | |
|---|---|---|---|---|---|
| | | | □ 5 mm | □ 20 mm | □ 50 mm |
| 120 | 5.2 | 2Ni—1Co—W | no warp (no crack) | no warp (no crack) | no warp (no crack) |
| 98 | 5.7 | 7Ni—3Cu—1Fe—W* | no warp (no crack) | no warp (no crack) | no warp (no crack) |
| 151 | 5.1 | 2Ni—1Cu—0.5Fe—W | no warp (no crack) | no warp (no crack) | no warp (no crack) |
| 108 | 8.4 | 10Ni—12Cu—5Fe—W* | warped (no crack) | warped (no crack) | warped (cracked) |
| 142 | 5.0 | 1.8Ni—0.8Cu—0.9Fe—W | no warp (no crack) | no warp (no crack) | no warp (no crack) |
| 131 | 5.4 | 3.0Ni—1.6Cu—0.4Fe—W | no warp (no crack) | no warp (no crack) | no warp (no crack) |
| 96 | 5.6 | 7.1Ni—2.5Cu—0.4Fe—W* | no warp (no crack) | no warp (no crack) | no warp (no crack) |

EXAMPLE 6

In the samples whose surfaces were subjected to gold plating in Example 5, aluminum nitride sintered substrates were soldered with various types of tungsten alloy plates by lead-indium solder at a temperature of 250° to 300° C., to perform a thermo cycle test (−55° C. to +150° C., 1000 cycles). Structures in the interiors of the aluminum nitride sintered substrates and metallized layer interfaces were observed in the respective samples, to evaluate presence/absence of cracks in the aluminum nitride sintered substrates and the states of warps caused in the tungsten alloy plates. Table 6 shows the results.

According to Table 6, no warp nor crack was recognized in the samples obtained by joining the tungsten alloy plates to the aluminum nitride sintered substrates in accordance with the present invention.

copper-tungsten alloy plates, 1.5 mm thick, the surfaces of which were subjected to nickel plating 2 μm thick, by silver solder at a temperature of 830° to 950° C. Examination was made on the respective samples thus obtained, as to cracks of the aluminum nitride sintered substrates and warps of the copper-tungsten alloy plates by the measuring methods as described with reference to Example 1.

Table 7 shows the results. The types of the tungsten alloy plates and evaluation of warps are indicated in a similar manner to Table 1. "6Cu-W", "10Cu-W" and "20Cu-W" represent reference examples.

According to Table 7, no warp nor crack was recognized in the samples obtained by joining the copper-tungsten alloy plates to the aluminum nitride sintered substrates in accordance with the present invention.

Further, metallized layers of the aforementioned compositions were formed on prescribed surfaces of the

TABLE 6

| Thermal Conductivity (W/mK) | Thermal Expansion Coefficient ($\times 10^{-6} K^{-1}$) | Type of w-Alloy Plate | Sample Shape | | |
|---|---|---|---|---|---|
| | | | □ 5 mm | □ 20 mm | □ 50 mm |
| 95 | 5.5 | 5Ni—1Cu—W* | no warp (no crack) | no warp (no crack) | no warp (no crack) |
| 90 | 5.4 | 5Ni—1Fe—W* | no warp (no crack) | no warp (no crack) | no warp (no crack) |
| 89 | 5.2 | 1Ni—1Fe—W* | no warp (no crack) | no warp (no crack) | no warp (no crack) |
| 84 | 6.4 | 12Ni—12Fe—W* | no warp (cracked) | no warp (cracked) | warped (cracked) |
| 120 | 5.2 | 2Ni—1Co—W | no warp (no crack) | no warp (no crack) | no warp (no crack) |
| 98 | 5.7 | 7Ni—3Cu—1Fe—W* | no warp (no crack) | no warp (no crack) | no warp (no crack) |
| 151 | 5.1 | 2Ni—1Cu—0.5Fe—W | no warp (no crack) | no warp (no crack) | no warp (no crack) |
| 108 | 8.4 | 10Ni—12Cu—5Fe—W* | no warp (cracked) | no warp (cracked) | warped (cracked) |
| 142 | 5.0 | 1.8Ni—0.8Cu—0.9Fe—W | no warp (no crack) | no warp (no crack) | no warp (no crack) |
| 131 | 5.4 | 3.0Ni—1.6Cu—0.4Fe—W | no warp (no crack) | no warp (no crack) | no warp (no crack) |
| 96 | 5.6 | 7.1Ni—2.5Cu—0.4Fe—W* | no warp (no crack) | no warp (no crack) | no warp (no crack) |

EXAMPLE 7

Samples obtained by performing nickel plating of 2 μm in thickness on aluminum nitride sintered substrates of 1.3 mm in thickness, which were formed with metallized layers similarly to Example 1, were soldered to samples of the aluminum nitride sintered substrates, and nickel plating layers 2 to 3 μm thick and gold plating layers 2 to 3 μm thick were sequentially formed on the same. Thereafter field-effect high-power transistors were soldered to the surfaces of the plating layers by gold-silicon soldering materials. In each a change $\Delta V_{BE}$ the forward effect voltage $V_{BE}$ across the emitter and the base of the transistor caused by power application was measured by $\Delta V_{BE}$ method, to evaluate the thermal resistance of the entire product integrally formed by the transistor, the aluminum nitride sintered substrate and the copper-tungsten alloy plate. The thermal resistance value thus measured in each sample was not more than about 1.9° C./W. Thus, it is understood that an aluminum nitride is suitable for carrying a semiconductor device thereby using a copper-tungsten alloy plate having the required thermal conductivity, as a radiating element.

According to Table 8, no warp nor crack was recognized in the samples obtained by joining the copper-tungsten alloy plates to the aluminum nitride sintered substrates in accordance with the present invention.

A thermo cycle test ($-55°$ C. to $+\frac{1}{8}°$ C., 1000 cycles) was performed on the nondefective samples of Examples 7 and 8 causing no warp nor crack, while no problem was recognized.

TABLE 8

| Thermal Conductivity (W/mK) | Thermal Expansion Coefficient ($\times 10^{-6} K^{-1}$) | Type of w-Alloy Plate | Sample Shape | | |
|---|---|---|---|---|---|
| | | | □ 5 mm | □ 20 mm | □ 50 mm |
| 170 | 4.5 | 0.1Cu—W | no warp (no crack) | no warp (no crack) | no warp (no crack) |
| 172 | 4.8 | 1Cu—W | no warp (no crack) | no warp (no crack) | no warp (no crack) |
| 174 | 5.1 | 2Cu—W | no warp (no crack) | no warp (no crack) | no warp (no crack) |
| 180 | 6.5 | 5Cu—W | no warp (no crack) | no warp (no crack) | no warp (no crack) |
| 185 | 6.6 | 6Cu—W | no warp (no crack) | no warp (no crack) | no warp (no crack) |
| 210 | 7.0 | 10Cu—W | no warp (no crack) | no warp (no crack) | warped (no crack) |
| 246 | 9.0 | 20Cu-W | warped (no crack) | warped (cracked) | warped (cracked) |

TABLE 7

| Thermal Conductivity (W/mK) | Thermal Expansion Coefficient ($\times 10^{-6} K^{-1}$) | Type of w-Alloy Plate | Sample Shape | | |
|---|---|---|---|---|---|
| | | | □ 5 mm | □ 20 mm | □ 50 mm |
| 170 | 4.5 | 0.1Cu—W | no warp (no crack) | no warp (no crack) | no warp (no crack) |
| 172 | 4.8 | 1Cu—W | no warp (no crack) | no warp (no crack) | no warp (no crack) |
| 174 | 5.1 | 2Cu—W | no warp (no crack) | no warp (no crack) | no warp (no crack) |
| 180 | 6.5 | 5Cu—W | no warp (no crack) | no warp (no crack) | no warp (no crack) |
| 185 | 6.6 | 6Cu—W | no warp (no crack) | warped (no crack) | warped (cracked) |
| 210 | 7.0 | 10Cu—W | warped (no crack) | warped (cracked) | warped (cracked) |
| 246 | 9.0 | 20Cu—W | warped (cracked) | warped (cracked) | warped (cracked) |

EXAMPLE 8

Gold plating 3 μm thick was performed on the surfaces of respective samples similar to those of Example 7, and aluminum nitride sintered substrates and copper-tungsten alloy plates were joined with each other by a gold solder at a temperature of 450° to 550° C. Examination was made on the respective samples thus obtained as to cracks of the aluminum nitride sintered substrates and wraps of the copper-tungsten alloy plates Table 8 shows the results.

EXAMPLE 9

Soldering was performed on respective samples subjected to gold plating similarly to Example 8 by lead-indium solder at a temperature of 250° to 300° C., to thereafter perform a thermo cycle test ($-55°$ C. to $+150°$ C., 1000 cycles). Structures in the interiors of the aluminum nitride sintered substrates and metallized layer interfaces were examined in the respective samples thus obtained, to evaluate cracks of the aluminum sintered substrates and warps of the copper-tungsten alloy plates. Table 9 shows the results. According to Table 9, no warp nor crack was recognized in the samples obtained by joining the copper-tungsten alloy plates to the aluminum nitride sintered substrates in accordance with the present invention.

TABLE 9

| Thermal Conductivity (W/mK) | Thermal Expansion Coefficient ($\times 10^{-6} K^{-1}$) | Type of w-Alloy Plate | Sample Shape □ 5 mm | □ 20 mm | □ 50 mm |
| --- | --- | --- | --- | --- | --- |
| 170 | 4.5 | 0.1Cu—W | no warp (no crack) | no warp (no crack) | no warp (no crack) |
| 172 | 4.8 | 1Cu—W | no warp (no crack) | no warp (no crack) | no warp (no crack) |
| 174 | 5.1 | 2Cu—W | no warp (no crack) | no warp (no crack) | no warp (no crack) |
| 180 | 6.5 | 5Cu—W | no warp (no crack) | no warp (no crack) | no warp (no crack) |
| 185 | 6.6 | 6Cu—W | no warp (no crack) | no warp (no crack) | no warp (no crack) |
| 210 | 7.0 | 10Cu—W | no warp (cracked) | no warp (cracked) | warped (cracked) |
| 246 | 9.0 | 20Cu—W | no warp (cracked) | no warp (cracked) | warped (cracked) |

EXAMPLE 10

Respective samples obtained by performing nickel plating 2 μm thick on the surfaces of aluminum nitride sintered substrates 1.3 mm thick formed with metallized layers similarly to Example 1, were joined to molybdenum metal plates or copper-tungsten alloy plates 1.5 mm thick provided with nickel plating 2 μm thick, by silver soldering at a temperature of 830° to 950° C. Examination was maed on the respective samples thus obtained, as to cracks of the aluminum nitride sintered substrates and warps of the molybdenum metal plates and the copper-tungsten alloy plates. Table 10 shows the results. Evaluation of warps and indication of the types of the copper-tungsten alloys are similar to those in Table 1.

According to Table 10, no warp nor crack was recognized in the samples obtained by joining the molybdenum metal plates to the aluminum nitride sintered substrates in accordance with the present invention.

TABLE 10

| Sample Shape | Mo | 10Cu—W | 20Cu—W |
| --- | --- | --- | --- |
| □ 5 mm | no warp (no crack) | warped (no crack) | warped (cracked) |
| □ 20 mm | no warp (no crack) | warped (cracked) | warped (cracked) |
| □ 50 mm | no warp (no crack) | warped (cracked) | warped (cracked) |

EXAMPLE 11

Gold plating 3 μm thick, was applied on the surfaces of respective samples similar to those of Example 10, and thereafter aluminum nitride sintered substrates were joined to molybdenum metal plates or copper-tungsten alloy plates by gold soldering at a temperature of 450° to 550° C. Examination was made on the respective samples thus obtained as to cracks of the aluminum nitride sintered substrates and warps of the molybdenum metal plates and the copper-tungsten alloy plates. Table 11 shows the results.

According to Table 11, no warp nor crack was recognized in the samples obtained by joining the molybdenum metal plates to the aluminum nitride sintered substrates in accordance with the present invention.

A thermo cycle test (−55° C. to +150° C., 1000 cycles) was performed on nondefective samples causing no warp nor crack in Examples 10 to 11, while no problem was recognized.

TABLE 11

| Sample Shape | Mo | 10Cu—W | 20Cu—W |
| --- | --- | --- | --- |
| □ 5 mm | no warp (no crack) | warped (no crack) | warped (no crack) |
| □ 20 mm | no warp (no crack) | warped (no crack) | warped (cracked) |
| □ 50 mm | no warp (no crack) | warped (no crack) | warped (cracked) |

EXAMPLE 12

Soldering was performed on respective samples provided with gold plating similarly to Example 11 by lead-indium solder at a temperature of 250° to 300° C., to thereafter perform a thermo cycle test (−55° C. to +150° C., 1000 cycles). Structures in the interiors of the aluminum nitride sintered substrates and metallized layer interfaces were examined in the respective samples thus obtained, to evaluate cracks of the aluminum nitride sintered substrates and the states of warps of molybdenum metal plates and copper tungsten alloy plates. Table 12 shows the results.

According to Table 12, no warp nor crack was recognized in the samples obtained by joining the molybdenum metal plates to aluminum nitride sintered substrates in accordance with the present invention.

TABLE 12

| Sample Shape | Mo | 10Cu—W | 20Cu—W |
| --- | --- | --- | --- |
| □ 5 mm | no warp (no crack) | no warp (cracked) | no warp (cracked) |
| □ 20 mm | no warp (no crack) | no warp (cracked) | no warp (cracked) |
| □ 50 mm | no warp (no crack) | warped (cracked) | warped (cracked) |

Although the present invention has been described and illusrated in detail, it is clearly understood that the same is by way of illustration and example only and is not to be taken by way of limitation, the spirit and scope of the present invention being limited only by the terms of the appended claims.

What is claimed is:

1. A semiconductor structure, comprising a semiconductor device, an insulating substrate formed as an aluminum nitride sintered body having a first major surface facing said semiconductor device, and a heat radiating heat sink joined to said insulating substrate on a second major surface of said insulating substrate opposite said first major surface, said heat radiating heat sink being made of a metal material having a thermal conductivity of at least 120 W/mK and a thermal expansion coefficient within a range of 4 to $6.0 \times 10^{-6}$/K, wherein said thermal conductivity and siad thermal expansion coefficient of said heat radiating heat sink are substantially equal to a respective thermal conductivity and thermal expansion coefficient of siad aluminum nitride of said insulating substrate, said metal material of said heat sink being selected from a first group consisting of tungsten and tungsten alloy, said tungsten alloy containing at least one metal selected from a second group consisting of nickel, copper, iron and cobalt, said second group being present in said tungsten alloy in a proportion of not more than ten percent by weight of said tungsten alloy.

2. The semiconductor structure of claim 1, wherein said semiconductor device is secured to said first major surface of said substrate.

3. The semiconductor structure of claim 1, wherein said insulating substrate includes a covering means for covering and protecting said semiconductor device on said substrate.

4. The semiconductor structure of claim 1, further comprising a metallized layer formed on at least one of said first and second major surfaces of said insulating substrate.

5. The semiconductor structure of claim 4, wherein said metallized layer contains at least one metal selected from a third group consisting of tungsten, molybdenum, and at least one compound selected from a fourth group consisting of aluminum nitride, aluminum oxide, aluminum oxynitride, and calcium oxide.

6. The semiconductor structure of claim 4, further comprising soldering means for joining said metallized layer to said heat radiating heat sink.

7. The semiconductor structure of claim 6, further comprising a plating layer formed on a junction surface between said metallized layer and said soldering means.

8. The semiconductor structure of claim 6, further comprising a plating layer formed on a junction surface between said heat radiating heat sink and said soldering means.

9. The semiconductor structure of claim 1, wherein said copper of said second group is present in a proportion of not more than 5 percent by weight of said tungsten alloy.

* * * * *